US012809252B2

(12) United States Patent
Yamashita

(10) Patent No.: US 12,809,252 B2
(45) Date of Patent: Nov. 24, 2026

(54) IMPRINTING DEVICE, IMPRINTING METHOD, AND METHOD FOR MANUFACTURING ARTICLE

(71) Applicant: CANON KABUSHIKI KAISHA, Tokyo (JP)

(72) Inventor: Keiji Yamashita, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 71 days.

(21) Appl. No.: 18/917,130

(22) Filed: Oct. 16, 2024

(65) Prior Publication Data

US 2025/0172867 A1 May 29, 2025

(30) Foreign Application Priority Data

Nov. 28, 2023 (JP) ................................ 2023-200848

(51) Int. Cl.
*G03F 7/00* (2006.01)

(52) U.S. Cl.
CPC ................................ *G03F 7/0002* (2013.01)

(58) Field of Classification Search
None
See application file for complete search history.

(56) References Cited

U.S. PATENT DOCUMENTS

2016/0016353 A1* 1/2016 Yamamoto ............ G03F 7/0002 425/150
2019/0263031 A1* 8/2019 Murasato ................ B29C 43/56
2020/0379342 A1* 12/2020 Tavakkoli Kermani Ghariehali ............ G03F 7/0002
2021/0223688 A1* 7/2021 Sato ...................... G03F 9/7042

FOREIGN PATENT DOCUMENTS

JP 6993799 B2 1/2022
KR 1020190073580 A 6/2019
KR 1020210093783 A 7/2021
TW 202339076 A 10/2023

OTHER PUBLICATIONS

Notice of Preliminary Rejection issued in Korean Appln. No. 10-2024-0158898 mailed Jul. 3, 2026.
Lee et al. "High-throughput step-and-repeat UV-nanoimprint lithography." Current Applied Physics, vol. 6, No. 1, pp. 92-98, Mar. 7, 2006.
Office Action issued in Taiwanese Appln. No. 113139714, dated Jul. 31, 2026.

* cited by examiner

*Primary Examiner* — Virak Nguon
(74) *Attorney, Agent, or Firm* — ROSSI, KIMMS & McDOWELL LLP

(57) ABSTRACT

Provided is an imprinting device configured to form a pattern by bringing a resin applied to a substrate into contact with a mold having a pattern and curing the resin, the device including a control unit configured to move the mold or the substrate to a next shot region so that a portion of the mold facing a periphery portion of the substrate at the time of imprinting a shot region of the periphery portion with the mold faces an inner side of the periphery portion of the substrate at the time of imprinting the next shot region.

8 Claims, 8 Drawing Sheets

IMPRINTING DEVICE, IMPRINTING METHOD, AND METHOD FOR MANUFACTURING ARTICLE

BACKGROUND OF THE INVENTION

Field of the Invention

The present invention relates to an imprinting device, an imprinting method, and a method for manufacturing an article.

Description of the Related Art

As the demand for miniaturization of semiconductor devices and MEMS advances, in addition to photolithography techniques in the related art, a microfabrication technique for molding an imprinting material on a substrate with a mold to mold a composition of the imprinting material on the substrate is attracting attention. This technique is also called an imprinting technique, and it enables a fine structure on the order of a few nanometers to be molded on a substrate.

Also, one imprinting technique is a photocuring method. In an imprinting device using this photocuring method, first, a photocurable resin is applied to a shot region, which is an imprinting region on a substrate.

Then, while alignment of a pattern portion of a mold (master) with the shot region is performed, the mold is brought into contact with (stamped on) a resin applied to the substrate to fill the mold with the resin. Next, by irradiating the resin with light to cure the resin and then separating (releasing) the mold from the resin, a composition of the resin is molded on the substrate.

In addition, in order to further improve productivity, it is also necessary to imprint a periphery portion (defect shot region) of a substrate to obtain more patterns on the substrate.

In an imprinting process using an imprinting technique, as in a photolithography process using light, a pattern to be newly formed is generally superimposed on a pattern or structure already formed on a substrate. For that reason, the substrate may be warped or have a step on a substrate periphery portion.

Further, a structure of a substrate chuck that holds a substrate, or, for example, a vacuum exhaust pressure used to hold the substrate can also cause a warp or local distortion. For that reason, a substrate used in an imprinting process using an imprinting technique is not necessarily flat, and this effect is particularly significant in a substrate periphery portion.

For that reason, when a defect shot region is imprinted, a resin disposed near the outermost periphery may not come into complete contact with a mold at the time of stamping, and the resin may stick to the mold. If the stuck resin remains while it cures due to irradiation with light, the resin remaining on the mold will be transferred to a substrate when the next shot region is imprinted, and will be detected as a defect.

In addition, depending on the order of imprinting (shot order), the resin stuck to the mold may be irradiated with light a plurality of times, which may cure the resin stuck to the mold more, resulting in occurrence of a plurality of defects.

On the other hand, Japanese Patent No. 6993799 describes a configuration in which, in an imprinting method of applying a resin to a plurality of regions at once and then performing stamping, curing, and releasing successively, the order of applying the resin and performing stamping, curing, and releasing is changed to improve the accuracy of resin application.

That is, there is a possibility of deviation of application positions of the resin from each pattern due to variations in arrangement of patterns and structures formed in advance on a substrate. Thus, in Japanese Patent No. 6993799, magnitudes of the variations in arrangement are classified, and the application positions of the resin are corrected for each classified region to reduce the deviation of the application positions of the resin from each pattern. It is described that the order of imprinting is changed in accordance with the variations in arrangement of each pattern.

However, although Japanese Patent No. 6993799 describes changing the order of imprinting in accordance with the variations in the arranged patterns, it does not take into account the order of imprinting when a periphery portion of a substrate is imprinted, or the like.

SUMMARY OF THE INVENTION

The present invention provides an imprinting device configured to form a pattern by bringing a resin applied to a substrate into contact with a mold having a pattern and curing the resin, the device including at least one processor or circuit configured to function as: a control unit configured to move the mold or the substrate to a next shot region so that a portion of the mold facing a periphery portion of the substrate at the time of imprinting a shot region of the periphery portion with the mold faces an inner side of the periphery portion of the substrate at the time of imprinting the next shot region.

Further features of the present invention will become apparent from the following description of the embodiments with reference to the attached drawings.

DESCRIPTION OF THE EMBODIMENTS

Hereinafter, with reference to the accompanying drawings, favorable modes of the present invention will be described using embodiments. In each diagram, the same reference signs are applied to the same members or elements, and duplicate description will be omitted or simplified.

First Embodiment

Figure 1:
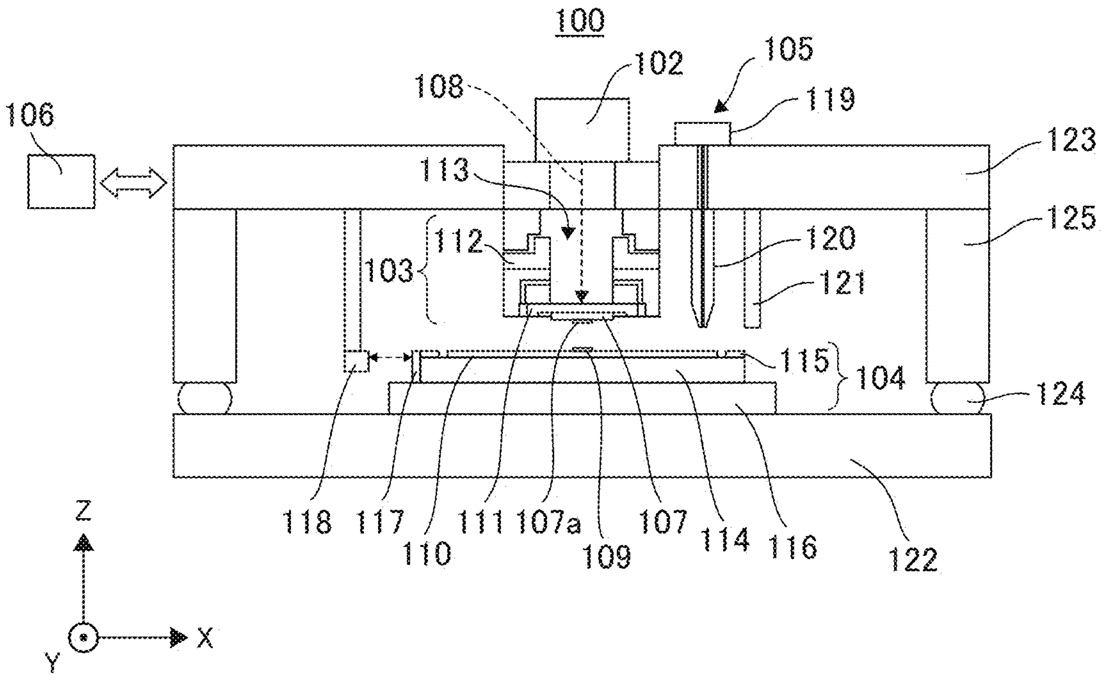
FIG. 1 is a schematic cross-sectional view of an imprinting device according to a first embodiment.

First, an imprinting device according to a first embodiment of the present invention will be described. FIG. 1 is a schematic cross-sectional view of the imprinting device according to the first embodiment. The imprinting device 100 is a device that is used for manufacturing a device such as a semiconductor device as an article and brings an uncured resin applied on a substrate into contact with a mold (hereinafter referred to as a mold) to cure and mold the resin, thereby forming a pattern of the resin on the substrate.

Also, here, the imprinting device uses a photocuring method. In addition, in the following figures, a Z axis is set to be parallel to an optical axis of an illumination system that irradiates the resin on the substrate with ultraviolet light, and X and Y axes are set to be orthogonal to each other in a plane perpendicular to the Z axis. First, the imprinting device 100 includes a light radiating unit 102, a mold holding mechanism 103, a substrate stage 104, an applying unit 105, and a control unit 106.

The light radiating unit 102 irradiates a mold 107 with ultraviolet light 108 during imprinting processing. This light radiating unit 102 includes a light source and an illumination optical system that adjusts the ultraviolet light 108 emitted from the light source to light suitable for imprinting and irradiates the mold 107 with the light.

The light source may be a kind of lamp such as a mercury lamp, but is not limited thereto as long as it is a light source that transmits light through the mold 107 and emits light of a wavelength that cures a resin (ultraviolet curable resin) 109 described below.

The illumination optical system may include a lens, a mirror, an aperture, and a shutter for performing switching between radiation and blocking of light. Also, in the present embodiment, the light radiating unit 102 is installed to adopt the photocuring method, but if a thermal curing method is adopted, for example, a heat source unit for curing a thermosetting resin may be installed instead of the light radiating unit 102.

The mold 107 has a polygonal outer peripheral shape (preferably a rectangular or square shape), and includes a pattern portion 107*a*, in which an uneven pattern to be transferred, such as a circuit pattern, is formed three-dimensionally on a surface facing a substrate 110. Also, a pattern size varies depending on a product to be manufactured, but fine patterns of several tens of nanometers are also included.

In addition, the mold 107 is preferably made of a material that can transmit the ultraviolet light 108 and has a low coefficient of thermal expansion, and for example, quartz is used. Further, the mold 107 may have a cavity that has a circular planar shape and a certain depth on a surface irradiated with the ultraviolet light 108.

The mold holding mechanism 103 includes a mold chuck 111 that holds the mold 107, a mold driving mechanism 112 that holds the mold chuck 111 movably, and a magnification correction mechanism (not shown) that corrects a shape of the mold 107 (pattern portion 107*a*).

The mold chuck 111 may hold the mold 107 by attracting an outer peripheral region of the surface of the mold 107 irradiated with the ultraviolet light 108 using a vacuum suction force or an electrostatic force. For example, if the mold 107 is held by a vacuum suction force, the mold chuck 111 is connected to an external vacuum pump (not shown), and by appropriately adjusting a suction pressure using exhaust of the vacuum pump, the suction force (holding force) on the mold 107 may be adjusted.

The mold driving mechanism 112 moves the mold 107 in each axis direction to selectively press or separate the mold 107 against or from a resin 109 on the substrate 110. For a power source of the mold driving mechanism 112, a linear motor or an air cylinder is used, for example.

Also, in order to cope with high-precision positioning of the mold 107, the mold driving mechanism 112 may be configured of a plurality of driving systems, such as a coarse driving system and a fine driving system. Further, the mold driving mechanism 112 may also have a position adjustment function not only in the Z axis direction, but also in the X axis direction, Y axis direction, or θ (rotation around the Z axis) direction, a tilt function for correcting an inclination of the mold 107, and the like.

Also, although each of the pressing and separating operations in the imprinting device 100 may be implemented by moving the mold 107 in the Z axis direction, it may also be implemented by moving the substrate stage 104 in the Z axis direction, or both.

In addition, a position of the mold 107 when the mold driving mechanism 112 is driven can be measured by a position measuring unit (not shown), such as an optical displacement meter that measures a distance between the mold 107 and the substrate 110.

The magnification correction mechanism is installed on the mold chuck 111 on a side holding the mold 107 and corrects the shape of the mold 107 (pattern portion 107*a*) by mechanically applying an external force or displacement to a side of the mold 107.

Further, the mold chuck 111 and the mold driving mechanism 112 have an opening region 113 at a center portion (inner side) in a planar direction, through which the ultraviolet light 108 radiated from the light radiating unit 102 can pass toward the substrate 110.

Here, the mold chuck 111 (or the mold driving mechanism 112) may be provided with a light transmitting member (for example, a glass plate) that makes a cavity surrounded by a part of the opening region 113 and the mold 107 into a sealed space.

In this case, a pressure inside the cavity is adjusted by a pressure adjustment device (not shown) including a vacuum pump, or the like. This pressure adjustment device, for example, sets the pressure inside the cavity to be higher than a pressure outside when the mold 107 is pressed against the resin 109.

Thus, the pattern portion 107*a* is bent in a convex shape toward the substrate 110 and can be brought into contact with the resin 109 starting from a center portion of the pattern portion 107*a*. Thus, the resin 109 can be filled into every corner of the uneven pattern of the pattern portion 107*a*.

The substrate 110 is, for example, a single crystal silicon substrate, a silicon on insulator (SOI) substrate, or a glass substrate. Also, before this substrate is carried into the imprinting device 100, a pattern formation region (hereinafter referred to as a “substrate side pattern”) has already been formed on this substrate in a pre-process (backing processing).

A pattern (layer including a pattern) of the resin 109 is further molded by the pattern portion 107*a* of the imprinting device onto a plurality of pattern formation regions on the substrate 110.

The substrate stage 104 holds the substrate 110 movably and performs, for example, alignment of the pattern portion 107*a* with the substrate side pattern when the mold 107 is pressed against the resin 109 on the substrate 110, or the like.

The substrate stage 104 includes a substrate chuck 114 that holds the substrate 110 using a suction force, an auxiliary member 115 installed to surround an outer periphery of the substrate 110, and a stage driving mechanism 116 that mechanically holds the substrate chuck 114 and allows it to be movable in each axis direction.

For example, the substrate chuck 114 supports the substrate 110 with a plurality of pins of uniform height and decompresses parts other than the pins by vacuum exhaust to hold the substrate 110. The stage driving mechanism 116 is a power source that generates little vibration while driving and stationary, and uses a linear motor or a planar motor, for example.

This stage driving mechanism 116 may also be configured of a plurality of driving systems, such as a coarse driving system and a fine driving system, for each of the X axis and Y axis directions. Further, it may have a driving system for position adjustment in the Z axis direction, a position adjustment function in the θ direction of the substrate 110, or a tilt function for correcting the inclination of the substrate 110.

The substrate stage 104 also includes a plurality of reference mirrors 117 on its side that correspond to each of X, Y, Z, ωx, ωy, and ωz directions. On the other hand, the imprinting device 100 includes a plurality of laser interferometers (position measurement mechanisms) 118 that measure a position of the substrate stage 104 by irradiating each of these reference mirrors 117 with a beam of helium neon or the like.

Also, FIG. 1 illustrates only one pair of the reference mirror 117 and the laser interferometer 118. The laser interferometer 118 measures the position of the substrate stage 104 in real time, and the control unit 106, which will be described later, performs positioning control of the substrate 110 (substrate stage 104) on the basis of the measurement value at this time.

In addition, the auxiliary member 115 has a surface height equivalent to that of the substrate 110 placed on the substrate chuck 114 and is used to prevent a gas from entering an optical path between the reference mirror 117 and the laser interferometer 118.

The applying unit 105 is installed near the mold holding mechanism 103 and applies the resin (uncured resin) 109 onto a shot region (the substrate side pattern) serving as the pattern formation region present on the substrate 110. The resin 109 is an ultraviolet curable resin (a photocurable resin or an imprinting material) that has the property of being cured by receiving the ultraviolet light 108, and is appropriately selected in accordance with various conditions such as a semiconductor device manufacturing process.

This applying unit 105 adopts, for example, an inkjet method as an applying method, and includes a container 119 that contains the uncured resin 109, and a droplet discharge unit 120. The container 119 is preferably one that can manage the resin 109 while maintaining an atmosphere in which a curing reaction of the resin 109 is not caused, for example, a small amount of oxygen is contained.

Also, a material of the container 119 is preferably one that does not allow particles or chemical impurities to be mixed into the resin 109. The droplet discharge unit 120 has, for example, a piezo-type discharge mechanism (inkjet head) that includes a plurality of discharge ports.

An amount of application (discharge) of the resin 109 can be adjusted in the range of 0.1 to 10 pL/drop and is usually about 1 pL/drop for use. In addition, the total amount of application of the resin 109 is determined in accordance with density of the pattern portion 107*a* and a desired remaining film thickness. The applying unit 105 distributes and applies the resin 109 onto the shot region as droplets on the basis of an operation command from the control unit 106, and controls an application position, an amount of application, and the like.

The control unit 106 includes a CPU serving as a computer, a memory serving as a storage medium storing a computer program, and the like, and may control an operation and adjustment of each constituent element of the imprinting device 100 in accordance with the computer program.

The control unit 106 of the present embodiment controls at least operations of the applying unit 105, the substrate stage 104, and a rotation mechanism, which will be described later. Also, the control unit 106 may be configured integrally with another part of the imprinting device 100 (in a common housing), or may be configured separately from another part of the imprinting device 100 (in a different housing).

Further, the imprinting device 100 includes an alignment measurement system 121 that measures alignment marks formed on the substrate 110. In addition, the imprinting device 100 includes a base plate 122 on which the substrate stage 104 is placed and which forms a reference plane, and a bridge base plate 123 on which the mold holding mechanism 103 is fixed.

The imprinting device 100 further includes a support 125 that extends from the base plate 122 and supports the bridge base plate 123 via a vibration isolator 124 that removes vibrations from a floor surface.

Further, the imprinting device 100 may include a mold transport mechanism that transports the mold 107 between an outside of the device and the mold holding mechanism 103, a substrate transport mechanism that transports the substrate 110 between an outside of the device and the substrate stage 104, and the like.

Figure 2:
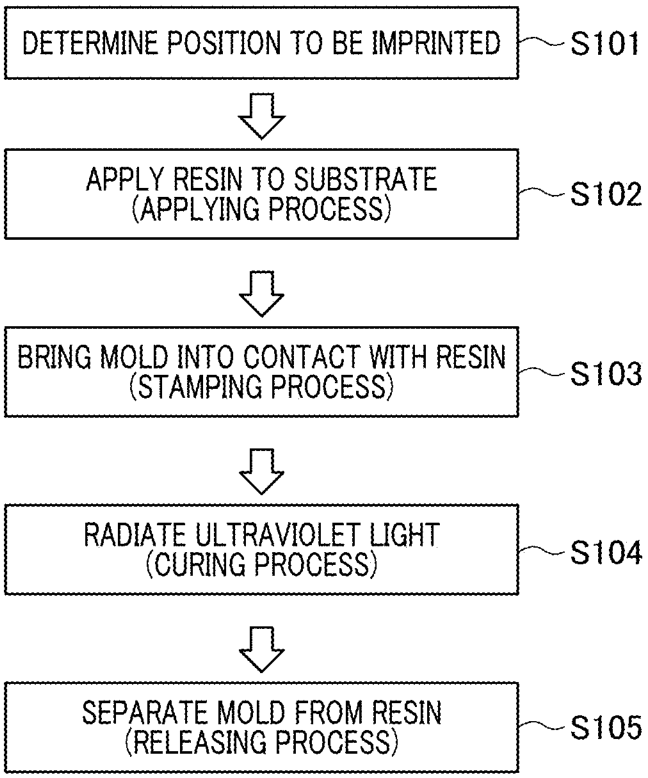
FIG. 2 is a flowchart showing an example of an imprinting processing method.

Next, an imprinting method (imprinting processing) using the imprinting device 100 will be described. FIG. 2 is a flowchart showing an example of an imprinting processing method. Also, a CPU or the like serving as a computer in the control unit 106 executes the computer program stored in the memory, and thus operations of each step in the flowchart in FIG. 2 are performed sequentially.

First, in step S101, the control unit 106 places and fixes the substrate 110 onto the substrate stage 104 using a substrate transport device (not shown). Next, the control unit 106 drives the stage driving mechanism 116 to appropriately change a position of the substrate 110 while causing the alignment measurement system 121 to sequentially measuring the alignment marks on the substrate 110, thereby detecting the position of the substrate 110 with high accuracy.

Then, the control unit 106 calculates each transfer coordinate from the detection results, and causes the stage driving mechanism 116 to position the application position (a specific position on the shot region) on the substrate 110 below a discharge port of the droplet discharge unit 120. That is, the position to be imprinted is determined.

After that, in step S102 (an applying process), the applying unit 105 applies the resin 109 to the shot region on the substrate 110 determined in step S101. Next, in step S103 (a stamping process), the control unit 106 causes the stage driving mechanism 116 to move and position the substrate 110 so that the shot region is located at a press position immediately below the pattern portion 107*a*.

Further, the control unit 106 performs alignment between the pattern portion 107*a* and the substrate side pattern on the shot region, and magnification correction of the pattern portion 107*a* using the magnification correction mechanism. After that, it drives the mold driving mechanism 112 to press the pattern portion 107*a* against the resin 109 on the shot region.

This pressing causes the resin 109 to fill the uneven pattern of the pattern portion 107*a*. In addition, the control unit 106 determines whether or not the pressing is completed using a load sensor (not shown) installed inside the mold holding mechanism 103.

Next, in step S104 (a curing process), the light radiating unit 102 radiates the ultraviolet light 108 from a back surface (top surface) of the mold 107 for a predetermined time as a curing process, and cures the resin 109 using the ultraviolet light 108 transmitted through the mold 107. Then, after the resin 109 has cured, in step S105 (a releasing process), the control unit 106 drives the mold driving mechanism 112 again to separate the pattern portion 107*a* from the substrate 110.

Thus, a three-dimensional resin pattern (layer) that follows the uneven pattern of the pattern portion 107*a* is formed on a surface of the shot region on the substrate 110. By performing such a series of imprinting operations (an imprinting process) a plurality of times while changing the shot region by driving the substrate stage 104, the imprinting device 100 can form a plurality of resin patterns on one substrate 110.

Also, when the mold 107 is pressed against the resin 109 on the substrate 110 to fill the pattern portion 107*a* with the resin 109, if air bubbles (air atmosphere) are present in a gap between the mold 107 and the substrate 110, an unfilled defect will occur in the formed pattern after curing.

For that reason, the gap between the mold 107 and the substrate 110 is replaced with a gas having at least one of properties of being highly soluble or highly diffusible in the resin 109. An example of the gas that has such a property is helium.

As a gas replacement method, the control unit 106 injects helium from a gas supply port (not shown) disposed at least around the mold 107 to increase a helium concentration around the mold 107. Thus, by continuing to inject helium for a certain period of time due to the diffusion effect of helium itself, the gap between the mold 107 and the substrate 110 can be replaced.

However, in such a gas replacement method, a certain waiting time is required until the helium concentration in the gap between the mold 107 and the substrate 110 is sufficiently increased. This has a negative impact on productivity, and thus it is required to shorten this waiting time as much as possible. For this reason, a gas replacement method that utilizes a gas flow using the drive of the substrate stage 104, the so-called Coanda effect, is effective.

Figure 3:
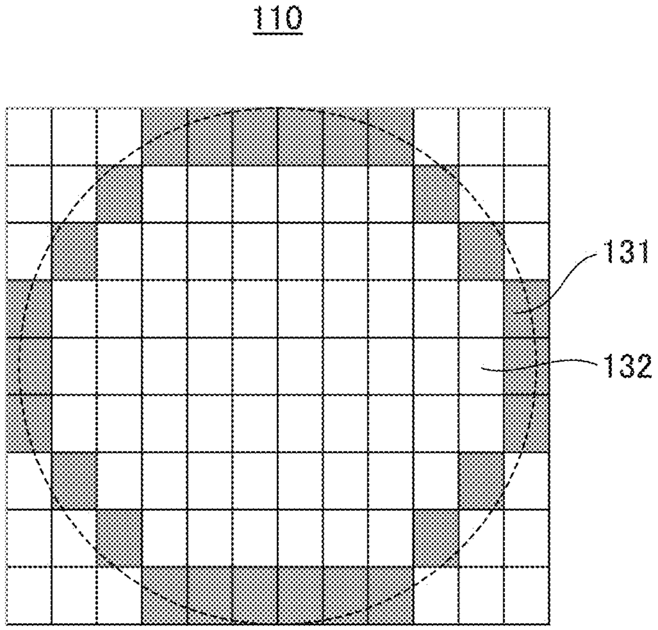
FIG. 3 is a diagram showing an example of a shot region for imprinting on a substrate.

Next, an imprinting device and an imprinting method for imprinting a periphery portion of the substrate 110 according to the first embodiment of the present invention will be described in detail. FIG. 3 is a diagram showing an example of the shot region for imprinting on a substrate, and FIG. 4 is a diagram for illustrating defects that occur when the periphery portion of the substrate is imprinted in imprinting processing in the related art.

In order to obtain more patterns on the substrate 110, it is required to imprint the periphery portion of the substrate as well. As shown in FIG. 3, the periphery portion of the substrate becomes a shot region of which a part is missing (called a defect shot region 131). Also, among the shot regions of the substrate, a shot region that is not a defect shot region, such as a shot region 132, is called a non-defect shot region.

Figure 4A:
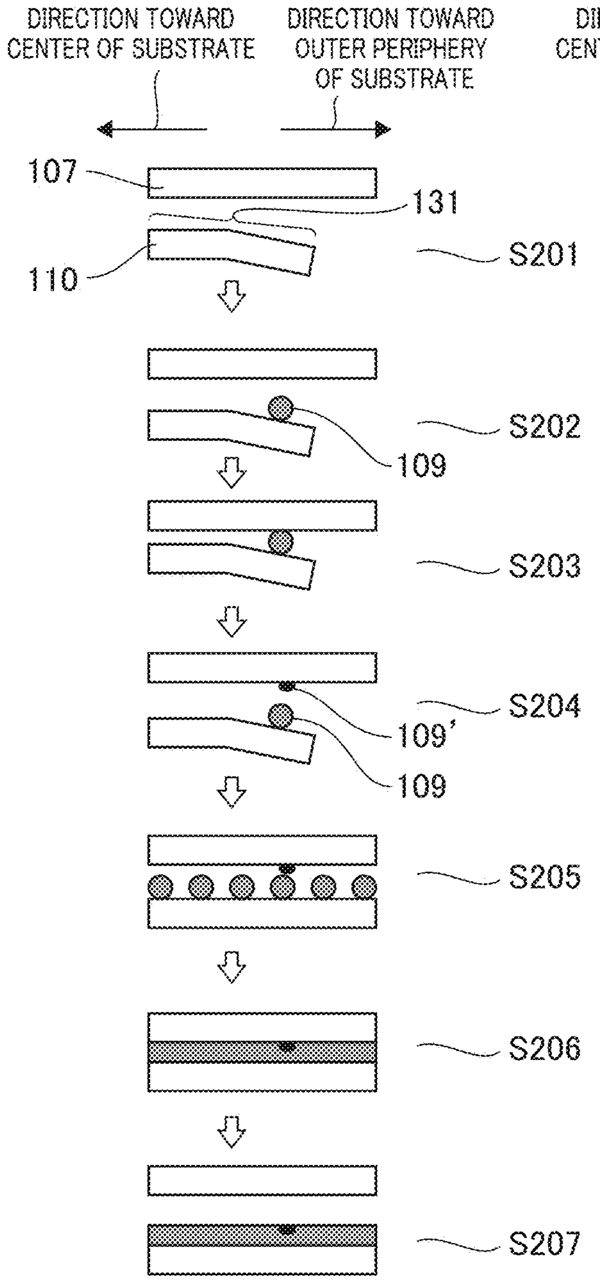
FIGS. 4A and 4B are diagrams for illustrating defects that occur when a periphery portion of a substrate is imprinted in imprinting processing in the related art.

The substrate 110 is held by, for example, the substrate chuck 114 using vacuum suction. For that reason, depending on a shape of the substrate chuck 114 and a pressure of the vacuum suction, a warp occurs in the periphery portion of the substrate 110, as shown in FIG. 4A.

Figure 4B:
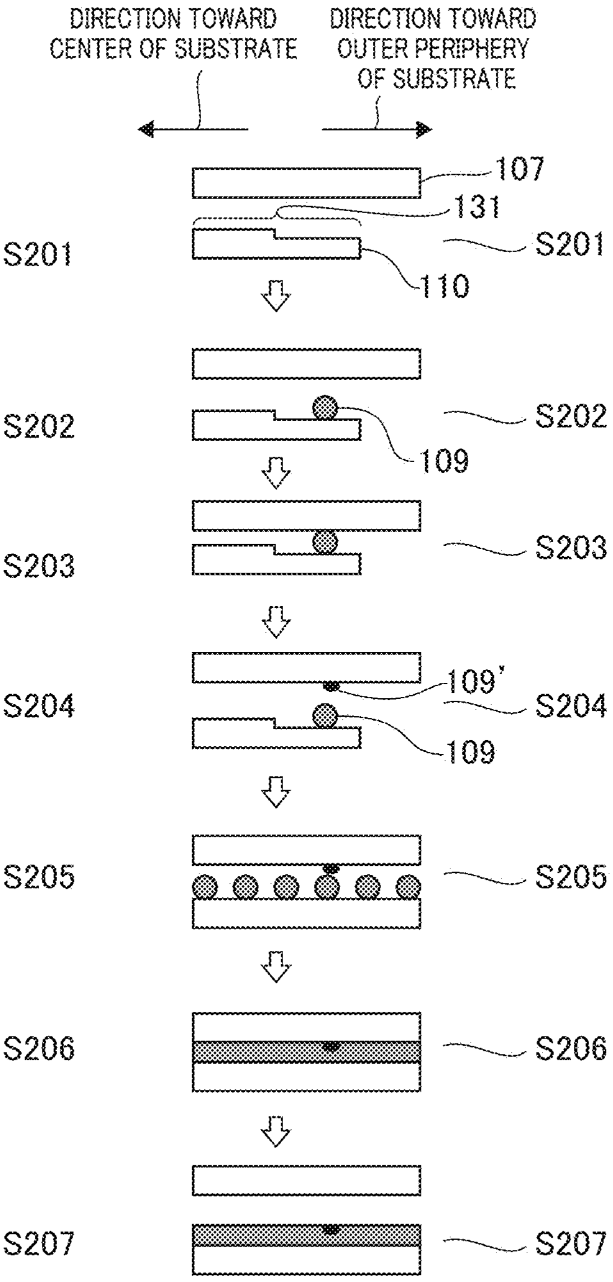

Also, since the substrate 110 to be imprinted has been through various pre-processes (for example, photolithography patterning using light, and the like), a step may be generated around the periphery portion of the substrate 110, as shown in FIG. 4B.

The defects that occur when the defect shot region 131 is imprinted will be described with reference to FIGS. 4A and 4B. Step S201 shows states of the mold 107 and the defect shot region 131 before imprinting processing.

The defect shot region 131 has a region having a warp or step in a substrate periphery portion. Next, in step S202, the resin 109 is applied to the defect shot region 131. Also, in step S202, only the resin 109 applied to the region having a warp or step is shown.

In the stamping process of step S203, the mold 107 comes into contact with the resin 109 applied to the region having a warp or step. In that case, as shown in step S204, if the contact between the mold 107 and the resin 109 is insufficient, the resin 109 may remain as a liquid on the mold 107.

In the subsequent curing process, the resin 109 remaining on the surface of the mold 107 is cured to become a resin 109'. Also, an amount of the remaining resin 109' varies depending on an atmosphere in the curing process. That is, the resin 109 has a property that it is less likely to cure due to oxygen inhibition in the air atmosphere, and if oxygen is present in the curing atmosphere, the resin 109' will volatilize without being cured sufficiently.

On the other hand, in order to prevent the pattern from being left unfilled due to the generation of air bubbles, helium gas is sprayed around the mold during imprinting to replace oxygen. Accordingly, for example, if helium is continued to be sprayed until the curing process, an oxygen concentration in the curing atmosphere will be lowered, and the resin 109' will be more likely to cure.

That is, if the oxygen concentration is low, the resin 109' will be further cured, an amount of volatilization will be reduced, and it will be more likely to remain on the surface of the mold 107. Accordingly, imprinting processing of the next shot region will be performed in a state in which the cured resin 109' is more likely to remain on the surface of the mold 107.

Steps S205 to S207 show how the next shot region is imprinted with the cured resin 109' remaining on the surface of the mold 107 after the defect shot region 131 has been imprinted. In step S205, the resin 109 is applied to an imprinting region of the next shot region. In that case, the cured resin 109' remains on the mold 107.

In step S206, the stamping process and the curing process are performed, and in step S207, the releasing process is performed. In that case, the resin 109' remaining on the mold 107 is taken into the resin 109 in the stamping process of step S206, and as in step S207, it is released from the mold 107 and remains in the resin 109.

Alternatively, the resin 109' may not be released from the mold 107, but may be released from the resin 109. As a result, defects occur in the resin 109.

Figure 5C:
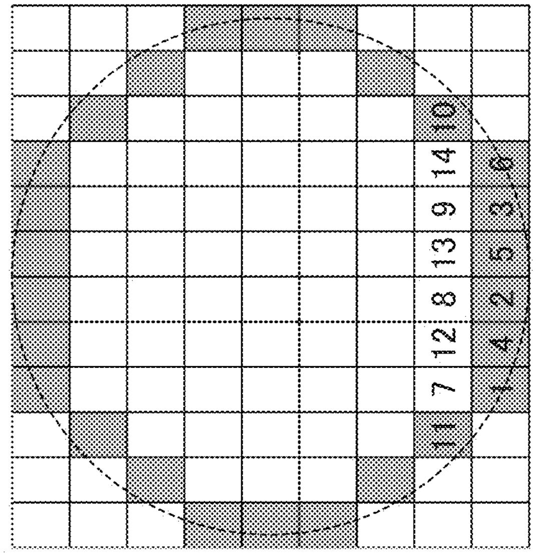
FIGS. 5A to 5C are diagrams for illustrating the order of imprinting according to the first embodiment.
Figure 5A:
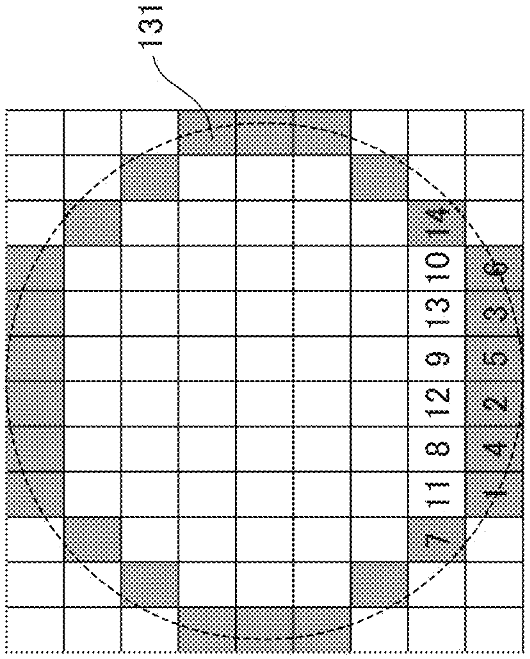
Figure 5B:
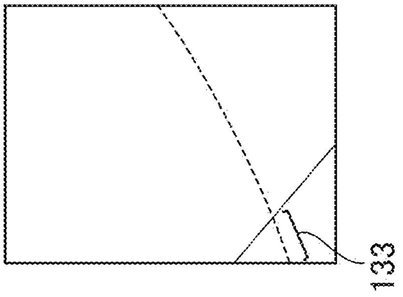

In addition, defects due to a defect shot region may also be likely to occur depending on the order of imprinting. FIGS. 5A to 5C are diagrams for illustrating the order of imprinting according to the first embodiment, and a defect caused by a defect shot region due to the order of imprinting will be described with reference to FIGS. 5A and 5B.

For example, a case of an imprinting method in which, in order to improve productivity, the resin 109 is applied to a plurality of regions at once and then stamped, cured, and released successively will be described. FIG. 5A is a diagram showing an example of the order of imprinting in the related art.

Numbers written on each region of the substrate 110 correspond to the order of imprinting and are written only on a lower side of the substrate 110. In the case of FIG. 5A, the resin 109 is applied to shot regions 1, 2, and 3 as one group at once. After that, the shot region 1 is stamped, cured, and released in sequence.

Subsequently, the shot region 2 is also stamped, cured, and released in sequence, and then the shot region 3 is also stamped, cured, and released in sequence. Next, the resin 109 is applied to shot regions 4, 5, and 6, and as in the above, stamping, curing, and releasing is repeated in sequence for each shot region. Such a case is shown above.

For example, when the shot region 6, which is a defect shot region, is imprinted, the resin 109' may remain on the surface of the mold 107, as described in FIGS. 4A and 4B. Then, with the resin 109' remaining on the surface of the mold 107, a shot region 7, which is the next defect shot region, is imprinted.

FIG. 5B shows an example of superimposing periphery portions of the shot region 6 and the shot region 7. The dotted line indicates the substrate periphery portion of the shot region 6, and the solid line indicates the substrate periphery portion of the shot region 7. The resin 109' sticks to the surface of the mold 107 along the substrate periphery portions of each shot region.

In the resin 109' stuck to the surface of the mold 107 in the shot region 6, the resin 109' stuck to a region 133 is present outside an imprinting region of the shot region 7 when the next shot region 7 is imprinted.

Accordingly, when the resin 109' stuck to the region 133 is exposed in the curing process at the time of imprinting the next shot region 7, the resin 109' is further cured while it is being stuck to the surface of the mold 107. Then, in the releasing process at the time of imprinting a shot region 8, as shown in, for example, FIGS. 4A and 4B, the shot region 8 is released from the mold 107 and detected as a defect.

Thus, in the imprinting method of the present embodiment, the order of imprinting is determined as shown in FIG. 5C. That is, the order of imprinting is determined so that, for example, the next shot region after imprinting the defect shot region 6 is the shot region 7 that has a shape including the substrate periphery portion of the defect shot region 6 and has an area larger than that of the defect shot region 6.

In the case of FIG. 5C, the order of imprinting is determined so that the next shot region 7 after imprinting the shot region 6, which is a defect shot region, is a non-defect shot region (a shot region that is not a defect shot region). However, it is sufficient that the next shot region 7 of the defect shot region 6 is not a completely non-defect shot region, as long as the substrate periphery portion of the defect shot region 6 is present within the imprinting region of the next shot region 7.

That is, the mold or the substrate may be moved to the next shot region so that a portion of the mold facing the periphery portion of the substrate at the time of imprinting the shot region in the periphery portion with the mold faces an inner side of the periphery portion of the substrate at the time of imprinting the next shot region. Then, the control unit 106 may relatively move the mold or the substrate in this manner on the basis of the computer program stored in the memory.

Also, if the region 133 remains even after changing the order of imprinting, the control unit 106 preferably determines the order of imprinting on the basis of the computer program stored in the memory so that the region 133 is minimized. Alternatively, a shot region layout may be changed. In this case, the occurrence of defects can also be inhibited.

The shot region layout may be changed so that the pattern can be more easily obtained during patterning by photolithography using light, and so that the region 133 does not exist (or can be minimized).

Figure 6B:
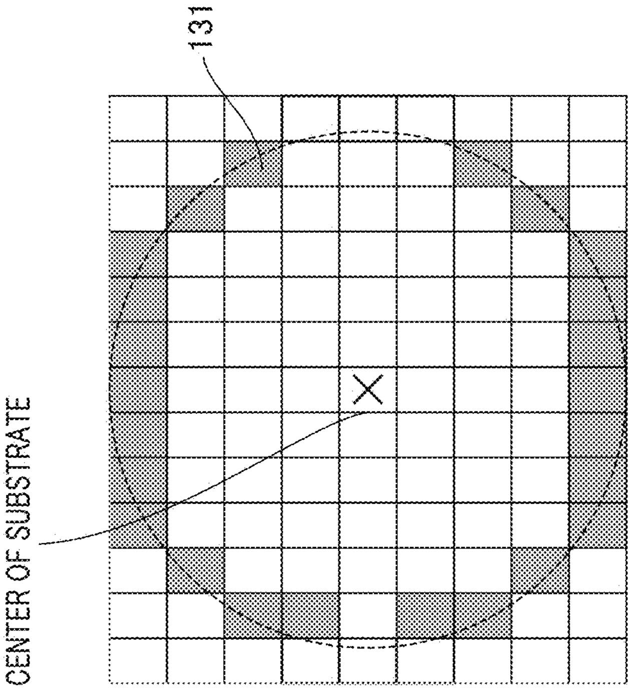
FIG. 6B is a diagram showing a modified example of a shot region layout in the imprinting method according to the first embodiment.
Figure 6A:
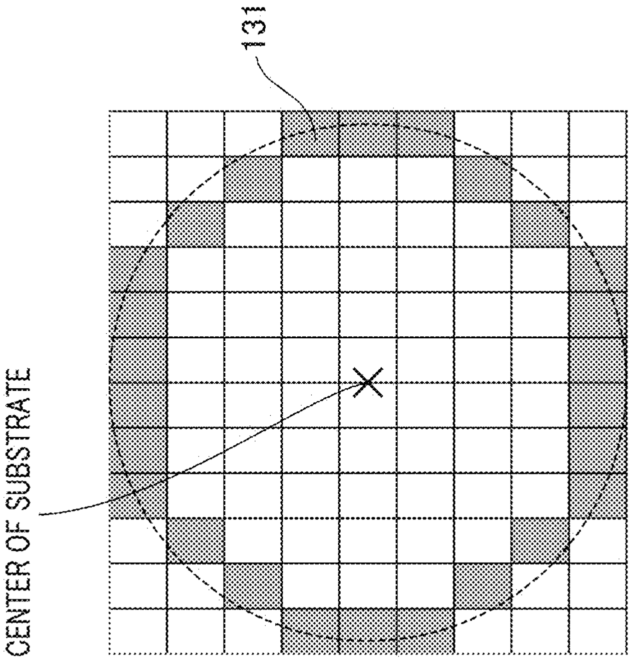
FIG. 6A is a diagram showing an example of a shot region layout in the related art.

FIG. 6A is a diagram showing an example of a shot region layout in the related art, and FIG. 6B is a diagram showing a modified example of the shot region layout in the imprinting method according to the first embodiment. As shown in FIG. 6B, the shot region layout may be modified by, for example, shifting center coordinates of the substrate, as compared to the shot region layout in the related art shown in FIG. 6A.

That is, it is also possible to reduce the region 133 in FIG. 5B by shifting the center coordinates of the substrate and controlling the order of imprinting as shown in FIG. 6B. Also, a direction and an amount of shifting the center coordinates of the substrate are not limited to the example in FIG. 6B.

The shot region layout of the substrate as shown in FIG. 6B is determined in advance by the computer program in the control unit 106. In addition, the control unit 106 determines an optimal order of imprinting in accordance with the shot region layout of the substrate.

In this way, the mold or the substrate can be moved to the next shot region so that a portion of the mold facing the periphery portion of the substrate at the time of imprinting the shot region in the periphery portion faces an inner side of the periphery portion of the substrate at the time of imprinting the next shot region. That is, the region 133 can be minimized by combining the shot region layout of the substrate and the order of imprinting.

Also, a size of the shot region may be changed. For example, a plurality of shot regions may be treated as one shot region, and a size of the shot region of the pattern portion 107*a* formed on the mold 107 may be changed with respect to a size of the shot region in pre-processing (backing processing).

For example, the pattern portion 107*a* formed on the mold 107 may be changed so that four shot regions in the pre-processing (backing processing) become one shot region. Thus, the order of imprinting may be determined so that the region 133 is minimized in accordance with the changed size of the shot region.

In addition, in order to prevent the resin 109' from curing further, for example, when the next shot region 7 of the defect shot region 6 is imprinted, the atmosphere in the curing process may be set to be an atmosphere that hinders curing of the resin 109', for example, an atmosphere containing oxygen.

That is, for example, when the next shot region 7 of the defect shot region 6 is imprinted, in the process of curing the resin, the control unit may supply a gas containing oxygen to the vicinity of the periphery portion to create an atmosphere that hinders the curing of the resin in the vicinity of the periphery portion. By creating an oxygen atmosphere, the resin 109' stuck to the mold 107 is less likely to cure, and thus defects caused by the resin 109' can be reduced.

Further, the control unit 106 may reduce an amount or a concentration of a replacement gas, such as helium, sprayed in the curing process of the next shot region 7 of the defect shot region 6, as compared to an amount or a concentration of the replacement gas sprayed in the curing process of the defect shot region 6.

As described above, according to the first embodiment, defects that occur when imprinting the periphery portion of the substrate 110 can be reduced.

Second Embodiment

Next, an imprinting device and an imprinting method according to a second embodiment of the present invention will be described. The present embodiment basically follows on from the first embodiment, and only different parts from the first embodiment will be described.

In the first embodiment, a case of the imprinting method in which, for the purpose of improving productivity, the resin 109 is applied to a plurality of regions at once and then stamped, cured, and released in sequence has been described. In the second embodiment, the imprinting method in which the resin 109 is applied to each shot region and stamped, cured, and released will be described.

Figure 7B:
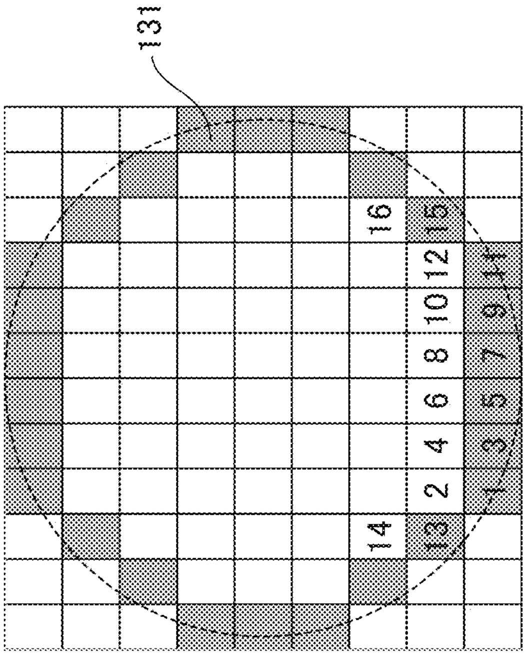
FIG. 7B is a diagram showing an example of the order of imprinting in an imprinting method according to a second embodiment.
Figure 7A:
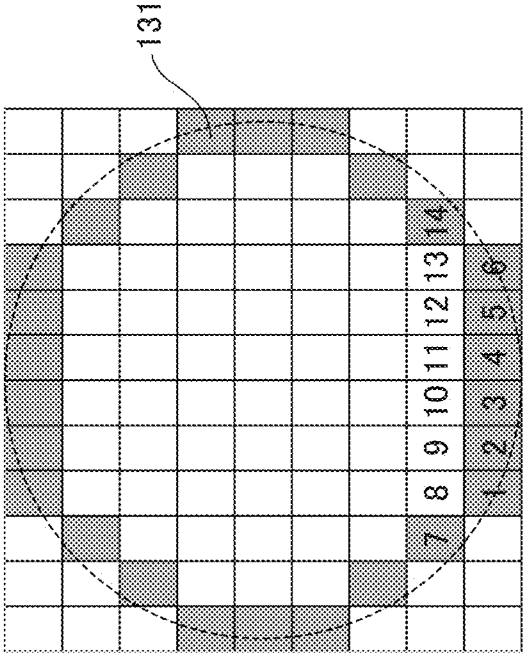
FIG. 7A is a diagram showing an example of the order of imprinting in the related art.

FIGS. 7A and 7B are diagrams for illustrating examples of the order of imprinting in the imprinting method according to the second embodiment, and FIG. 7A is a diagram showing an example of the order of imprinting order in the related art. FIG. 7B is a diagram showing an example of the order of imprinting in the imprinting method according to the second embodiment.

Numbers written on each region of the substrate 110 correspond to the order of imprinting and are written only on a lower side of the substrate 110. In the order of imprinting in the related art shown in FIG. 7A, for example, imprinting is performed in order from the lower left to the right, and the upper right region is imprinted last to process the substrate 110.

With such an order, for example, after the defect shot region 6 is imprinted, the defect shot region 7 may be imprinted next. For that reason, as described in the first embodiment as well, for example, the resin 109' stuck to the mold 107 in the defect shot region 6 may enter the region 133 outside the imprinting region of the next shot region 7.

For that reason, in the second embodiment, the order of imprinting is determined as shown in FIG. 7B. That is, for example, the order of imprinting is determined so that the next shot region 7 after the defect shot region 6 is imprinted becomes a shot region that has a shape including the substrate periphery portion of the defect shot region 6 and has an area larger than the defect shot region 6, for example.

For example, in FIG. 7B, the order of imprinting is determined so that the next shot region of the defect shot region is a non-defect shot region.

In addition, in order to prevent the resin 109' from curing further, when the defect shot region 6 is imprinted, a gas containing oxygen may be supplied to the vicinity of the periphery portion in the curing process for curing the resin to create an atmosphere that hinders the curing of the resin 109'.

That is, when the defect shot region 6 (a shot region on the periphery portion of the substrate) is imprinted, the control unit may supply a gas containing oxygen to the vicinity of the periphery portion in the process of curing the resin to create an atmosphere that hinders the curing of the resin in the vicinity of the periphery portion.

By creating an oxygen atmosphere, the resin 109' stuck to the mold 107 is less likely to cure, and thus defects caused by the resin 109' can be reduced.

As described above, according to the second embodiment, defects that occur when the periphery portion of the substrate 110 is imprinted can be reduced. Also, the first embodiment and the second embodiment may be combined as appropriate.

(Method for Manufacturing Article)

The pattern of the cured material formed using the imprinting device or imprinting method of the above embodiment is used permanently as at least a part of various articles, or temporarily at the time of manufacturing various articles. The article is an electric circuit element, an optical element, a MEMS, a recording element, a sensor, a mold, or the like.

Examples of the electric circuit element include a volatile or non-volatile semiconductor memory such as DRAM, SRAM, a flash memory, or MRAM, a semiconductor element such as LSI, CCD, an image sensor, or FPGA, and the like. Examples of the mold include a mold for imprinting, and the like.

The pattern of the cured material is used as it is as a constituent member of at least a part of the above article, or used temporarily as a resist mask. The resist mask is removed after etching or ion implantation is performed in a machining process of the substrate.

Figure 8A:
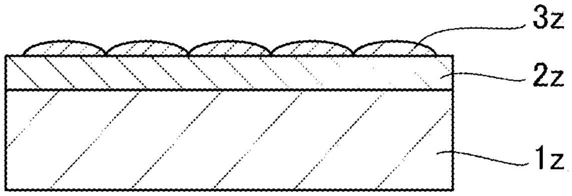
FIGS. 8A to 8F are schematic diagrams for illustrating an example of a method for manufacturing an article.

Next, a specific method for manufacturing an article will be described. FIGS. 8A to 8F are schematic diagrams for illustrating an example of the method for manufacturing an article. As shown in FIG. 8A, a substrate 1*z* such as a silicon wafer on which a workpiece 2*z* such as an insulator is formed is prepared, and then an imprinting material 3*z* is applied to a surface of the workpiece 2*z* using an inkjet method or the like. Here, a state in which the imprinting material 3*z* in the form of a plurality of droplets is applied to the substrate is shown.

Figure 8B:
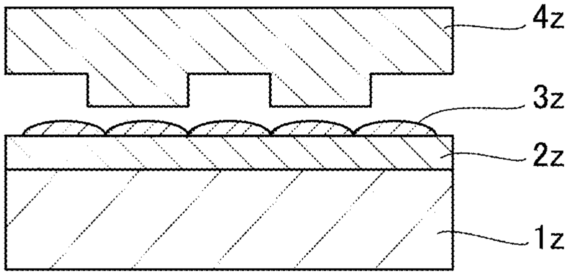
Figure 8C:
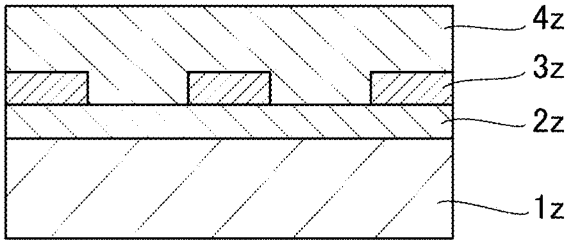

As shown in FIG. 8B, a mold 4*z* for imprinting is placed so that a side thereof on which an uneven pattern is formed faces the imprinting material 3*z* on the substrate. As shown in FIG. 8C, the substrate 1*z* on which the imprinting material 3*z* is applied is brought into contact with the mold 4*z*, and a pressure is applied thereto. A gap between the mold 4*z* and the workpiece 2*z* is filled with the imprinting material 3*z*. In this state, when light serving as energy for curing is radiated to pass through the mold 4*z*, the imprinting material 3*z* cures.

Figure 8D:
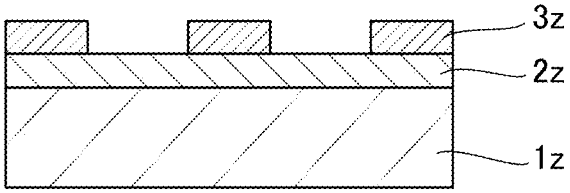

As shown in FIG. 8D, when the imprinting material 3*z* is cured and then the mold 4*z* is separated from the substrate 1*z*, a pattern of the cured imprinting material 3*z* is molded on the substrate 1*z*. This pattern of the cured material has a shape in which concave portions of the mold correspond to convex portions of the cured material and convex portions of the mold correspond to concave portions of the cured material, that is, the uneven pattern of the mold 4*z* is transferred to the imprinting material 3*z*.

Figure 8E:
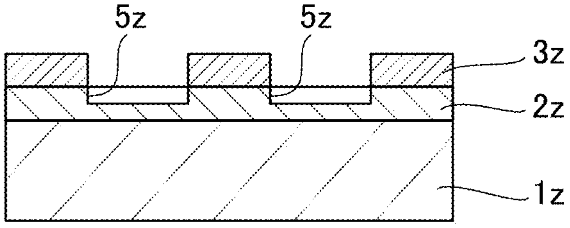

After the pattern of the resin is formed on the substrate through the imprinting process shown in FIGS. 8A to 8D, etching is performed using the pattern of the cured material as an etching-resistant mask, as shown in FIG. 8E. Then, portions of the surface of the workpiece 2*z* at which there is no cured material or only a thin layer of the cured material remains are removed to form grooves 5*z*.

Figure 8F:
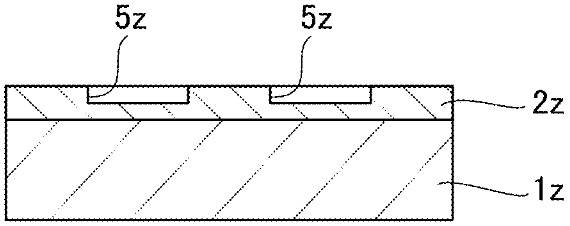

As shown in FIG. 8F, when the pattern of the cured material is removed, an article in which the grooves 5*z* are formed on the surface of the workpiece 2*z* can be obtained. Here, FIGS. 8E and 8F are examples of processes for machining the substrate on which the pattern is formed in the imprinting process. Also, here, the pattern of the cured material is removed, but it may be used as, for example, an interlayer insulating film included in a semiconductor element or the like, that is, a constituent member of an article, without being removed after machining.

Also, although an example of using a mold for transferring a circuit pattern on which an uneven pattern is provided as the mold 4*z* has been described, a mold (blank template) having a flat surface portion without an uneven pattern may also be used.

The blank template is used in a planarization device (molding device) that performs planarization processing (molding processing) in which the flat surface portion is used to mold a composition on the substrate to flatten it. The planarization processing includes a process of curing the composition by radiating light or by heating while the flat portion of the blank template is brought into contact with the composition supplied onto the substrate.

Further, as one example of the molding device, the imprinting device that molds (shapes) the imprinting material on the substrate using the mold to mold the pattern on the substrate has been described, but the present invention is not limited to the imprinting device.

As one example of the molding device, a planarization device that uses a mold (blank template) having a flat surface portion without an uneven pattern as the mold to perform planarization processing (molding processing) to mold the composition on the substrate to flatten it may be used.

In the first and second embodiments, the imprinting method and the imprinting device using a photocuring method have been described. However, even if the step of radiating light and curing is changed to a step of heating and curing using a thermal curing method, the operations and effects of the present invention are the same. That is, the present invention is applicable to a thermal curing method.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the imprinting device or the like through a network or various storage media. Then, a computer (or a CPU, an MPU, or the like) of the imprinting device or the like may be configured to read and execute the program. In such a case, the program and the storage medium storing the program configure the present invention.

In addition, the present invention includes those realized using at least one processor or circuit configured to perform functions of the embodiments explained above. For example, a plurality of processors may be used for distribution processing to perform functions of the embodiments explained above.

This application claims the benefit of priority from Japanese Patent Application No. 2023-200848, filed on Nov. 28, 2023, which is hereby incorporated by reference herein in its entirety.

What is claimed is:

1. An imprinting device configured to form a pattern by bringing a resin applied to a substrate into contact with a mold having a pattern and curing the resin, the device comprising at least one processor or circuit configured to function as:

a control unit configured to move the mold or the substrate to a next shot region so that a portion of the mold facing a periphery portion of the substrate at the time of imprinting a shot region of the periphery portion with the mold faces an inner side of the periphery portion of the substrate at the time of imprinting the next shot region, wherein a substrate periphery portion of the shot region in the periphery portion is present within an imprinting region of the next shot region.

2. The imprinting device according to claim 1, wherein the control unit is further configured to determine an order of shot regions for imprinting.

3. The imprinting device according to claim 1, wherein the control unit is further configured to determine a shot region layout of the substrate.

4. The imprinting device according to claim 3, wherein the control unit is further configured to determine an order of shot regions for imprinting in accordance with the shot region layout.

5. The imprinting device according to claim 1, wherein the control unit is further configured to create an atmosphere that hinders the curing of the resin in the vicinity of the periphery portion in a process of curing the resin at the time of imprinting the shot region of the periphery portion or at the time of imprinting the next shot region.

6. The imprinting device according to claim 5, wherein the control unit is further configured to supply a gas containing oxygen to the vicinity of the periphery portion in the process of curing the resin at the time of imprinting the shot region of the periphery portion or at the time of imprinting the next shot region.

7. An imprinting method for forming a pattern by bringing a resin applied to a substrate into contact with a mold having a pattern and curing the resin, the method comprising:

moving the mold or the substrate to a next shot region so that a portion of the mold facing a periphery portion of the substrate at the time of imprinting a shot region in the periphery portion with the mold faces an inner side of the periphery portion of the substrate at the time of imprinting the next shot region, wherein a substrate periphery portion of the shot region in the periphery portion is present within an imprinting region of the next shot region; and forming the pattern on the substrate.

8. A method for manufacturing an article comprising:

when imprinting is performed by bringing a resin applied to a substrate into contact with a mold having a pattern and curing the resin to form a pattern:

performing control to move the mold or the substrate to a next shot region so that a portion of the mold facing a periphery portion of the substrate at the time of imprinting a shot region in the periphery portion with the mold faces an inner side of the periphery portion of the substrate at the time of imprinting the next shot region, wherein a substrate periphery portion of the shot region in the periphery portion is present within an imprinting region of the next shot region; and forming the pattern on the substrate; and machining the substrate on which the pattern is formed.

* * * * *